United States Patent
Bangsaruntip et al.

(10) Patent No.: US 8,263,477 B2
(45) Date of Patent: Sep. 11, 2012

(54) STRUCTURE FOR USE IN FABRICATION OF PIN HETEROJUNCTION TFET

(75) Inventors: Sarunya Bangsaruntip, Yorktown Heights, NY (US); Steven Koester, Yorktown Heights, NY (US); Isaac Lauer, Yorktown Heights, NY (US); Jeffrey W. Sleight, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 203 days.

(21) Appl. No.: 12/684,331

(22) Filed: Jan. 8, 2010

(65) Prior Publication Data

US 2011/0169051 A1 Jul. 14, 2011

(51) Int. Cl.
*H01L 29/06* (2006.01)
*H01L 21/762* (2006.01)
*H01L 29/78* (2006.01)

(52) U.S. Cl. .............. 438/458; 257/192; 257/E21.568; 257/E29.255; 257/E29.02

(58) Field of Classification Search .......... 438/458, 438/142, 164; 257/192, 903, E21.568, E29.255, 257/E29.02

See application file for complete search history.

(56) References Cited

U.S. PATENT DOCUMENTS

| 6,504,173 | B2* | 1/2003 | Hsu et al. ................. 257/60 |
| 7,198,990 | B2* | 4/2007 | Joshi et al. ............... 438/142 |
| 7,276,424 | B2 | 10/2007 | Wei |
| 7,465,976 | B2* | 12/2008 | Kavalieros et al. ........ 257/213 |
| 7,534,675 | B2 | 5/2009 | Bangsaruntip et al. |
| 2004/0152272 | A1* | 8/2004 | Fladre et al. ............. 438/284 |
| 2008/0026534 | A1 | 1/2008 | Avouris et al. |
| 2008/0067495 | A1 | 3/2008 | Verhulst |
| 2008/0067607 | A1 | 3/2008 | Verhulst et al. |
| 2008/0173901 | A1* | 7/2008 | Zhu ........................ 257/213 |
| 2008/0210937 | A1 | 9/2008 | Kobayashi et al. |
| 2009/0061557 | A1* | 3/2009 | Akiyama et al. ........... 438/94 |

* cited by examiner

*Primary Examiner* — Thao Le
*Assistant Examiner* — Sheng Zhu
(74) *Attorney, Agent, or Firm* — Cantor Colburn LLP; Vazken Alexanian (57) ABSTRACT

A method for fabricating a structure for use in fabrication of a PiN heterojunction tunnel field effect transistor (TFET) includes forming an alignment trench in a silicon wafer; forming a silicon germanium (SiGe) growth trench in the silicon wafer; growing a p-type SiGe region in the SiGe growth trench; forming a first oxide layer over the alignment trench and the p-type SiGe region; forming a hydrogen implantation region in the silicon wafer, the hydrogen implantation region dividing the silicon wafer into a upper silicon region and a lower silicon region; bonding the first oxide layer to a second oxide layer located on a handle wafer, forming a bonded oxide layer comprising the first oxide layer and the second oxide layer; and separating the lower silicon region from the upper silicon region at the hydrogen implantation region.

15 Claims, 14 Drawing Sheets

100

FORM ZERO LEVEL TRENCH AND SIGE GROWTH TRENCH IN SILICON
101

GROW P-TYPE SIGE IN SIGE GROWTH TRENCH
102

POLISH; FORM OXIDE LAYER
103

FORM HYDROGEN IMPLANTATION REGION IN SILICON
104

BOND OXIDE LAYER TO OXIDE LAYER OF HANDLE WAFER
105

ANNEAL TO RELEASE SILICON BELOW HYDROGEN IMPLANTATION REGION, POLISH
106

Structure for use in fabrication of PiN heterojunction TFET

Field

This disclosure relates generally to the field of semiconductor device fabrication.

Description of Related Art

Tunnel field effect transistors (TFETs) offer improved sub-threshold slope over other complementary metal-oxide-semiconductor (CMOS) devices. A TFET comprises a tunnel barrier, which may comprise a PiN junction. A PiN junction is a semiconductor device having three contiguous regions: p-type doped, intrinsic, and n-type doped. The height of the tunnel barrier may be modulated by the TFET gate potential, controlling the transport current of the TFET. This mechanism of TFET transport current control may give a relatively steep sub-threshold slope. However, the ability of the gate potential of a TFET to modulate the TFET tunnel barrier height may lessen over time, as an inversion layer may form in the TFET due to screening.

Summary

In one aspect, a method for fabricating a structure for use in fabrication of a PiN heterojunction tunnel field effect transistor (TFET) includes forming an alignment trench in a silicon wafer; forming a silicon germanium (SiGe) growth trench in the silicon wafer; growing a p-type SiGe region in the SiGe growth trench; forming a first oxide layer over the alignment trench and the p-type SiGe region; forming a hydrogen implantation region in the silicon wafer, the hydrogen implantation region dividing the silicon wafer into a upper silicon region and a lower silicon region; bonding the first oxide layer to a second oxide layer located on a handle wafer, forming a bonded oxide layer comprising the first oxide layer and the second oxide layer; and separating the lower silicon region from the upper silicon region at the hydrogen implantation region.

In one aspect, a structure for use in fabrication of a PiN heterojunction tunnel field effect transistor (TFET) includes a silicon layer, the silicon layer comprising an alignment trench and a p-type silicon germanium (SiGe) region; and an oxide layer over the alignment trench and the p-type SiGe region.

Additional features are realized through the techniques of the present exemplary embodiment. Other embodiments are described in detail herein and are considered a part of what is claimed. For a better understanding of the features of the exemplary embodiment, refer to the description and to the drawings.

Brief Description of the Several Views of the Drawings

Referring now to the drawings wherein like elements are numbered alike in the several FIGURES.

Detailed Description

Embodiments of systems and methods for fabricating a structure for use in fabrication of a TFET having a tunnel barrier comprising a PiN heterojunction are provided, with exemplary embodiments being discussed below in detail. In a PiN heterojunction, at least one of the three regions comprising the heterojunction is made from a different material from the other regions. A PiN heterojunction TFET may operate at its quantum capacitance limit, at which the total gate capacitance is dominated by the semiconductor, or quantum, capacitance as opposed to the geometrical oxide capacitance. At the quantum capacitance limit, substantial scaling benefits are obtained. Screening is reduced, and the TFET gate potential may have relatively strong control of the tunnel barrier height. Control of the tunnel barrier height may be independent of the applied gate bias. A linear change in the TFET gate bias may cause a linear change in the tunnel barrier height, and an exponential change in the TFET transport current. The structure also comprises a zero level trench, or alignment trench, for aligning additional wiring layers that may be formed in subsequent processing steps.

Figure 1:
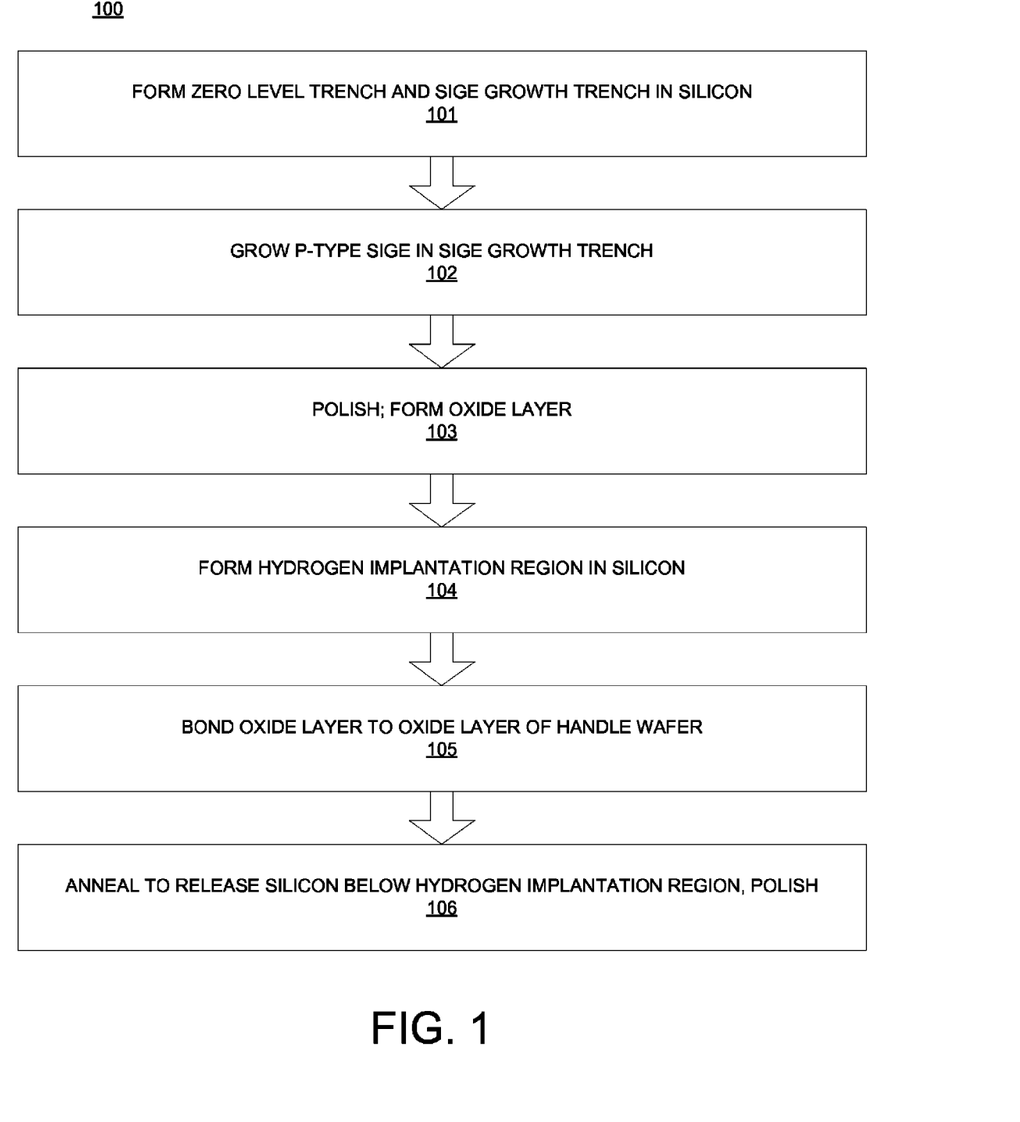
FIG. 1 illustrates an embodiment of a method for fabricating a structure for use in fabricating a PiN heterojunction TFET.
Figure 2:
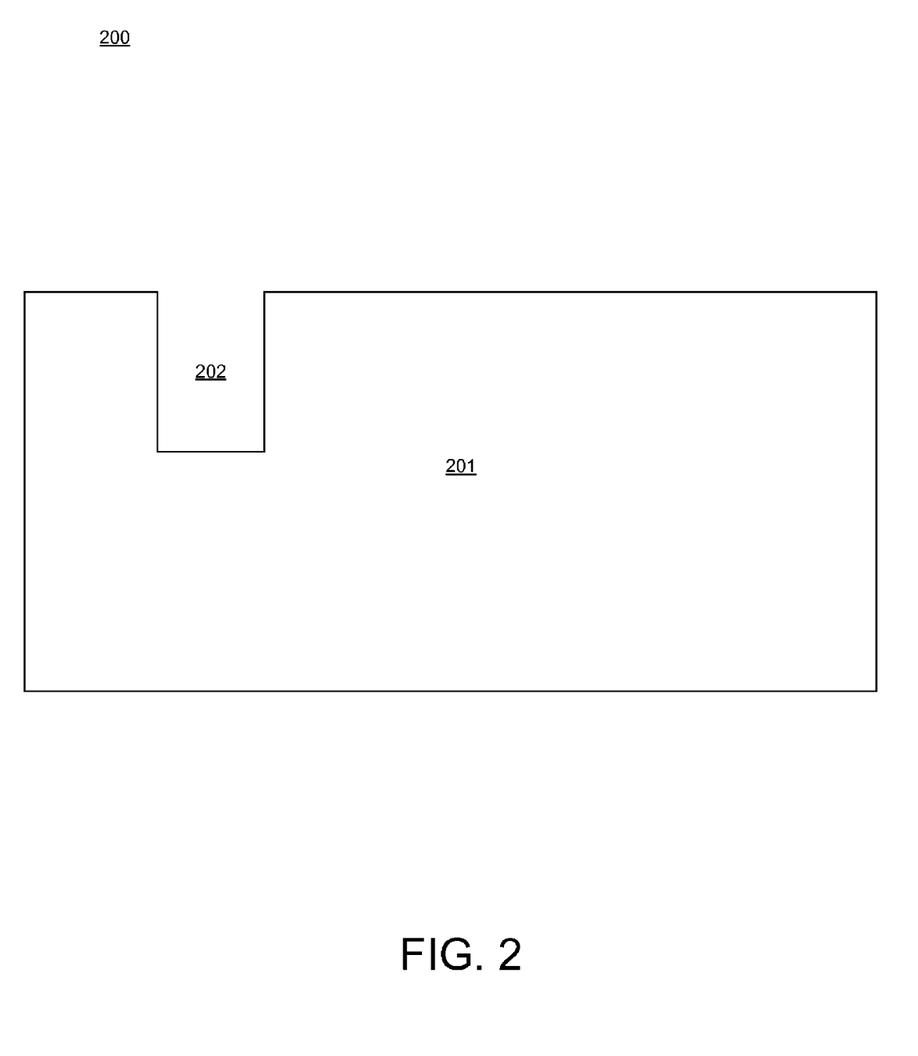
FIG. 2 illustrates an embodiment of a wafer comprising an alignment layer.
Figure 3:
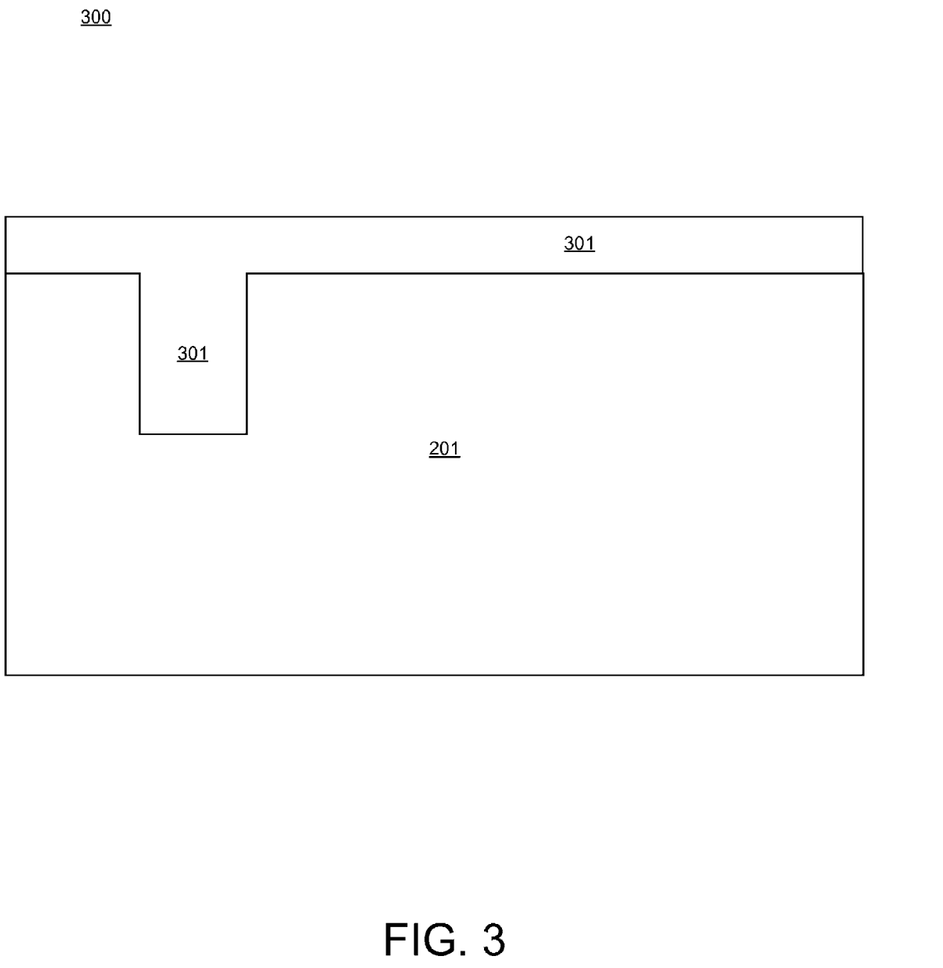
FIG. 3 illustrates an embodiment of a wafer after application of a hard mask layer.
Figure 4:
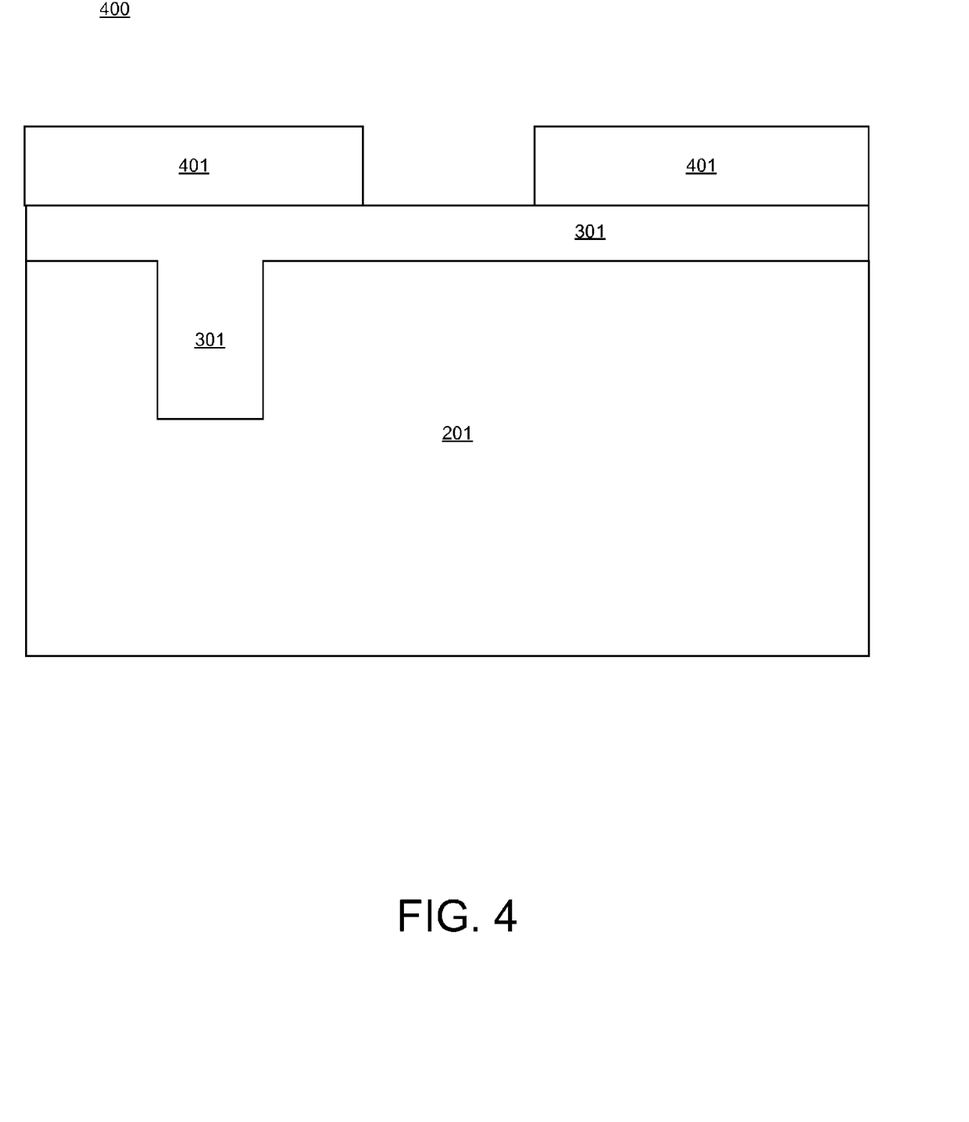
FIG. 4 illustrates an embodiment of a wafer after application of resist.
Figure 5:
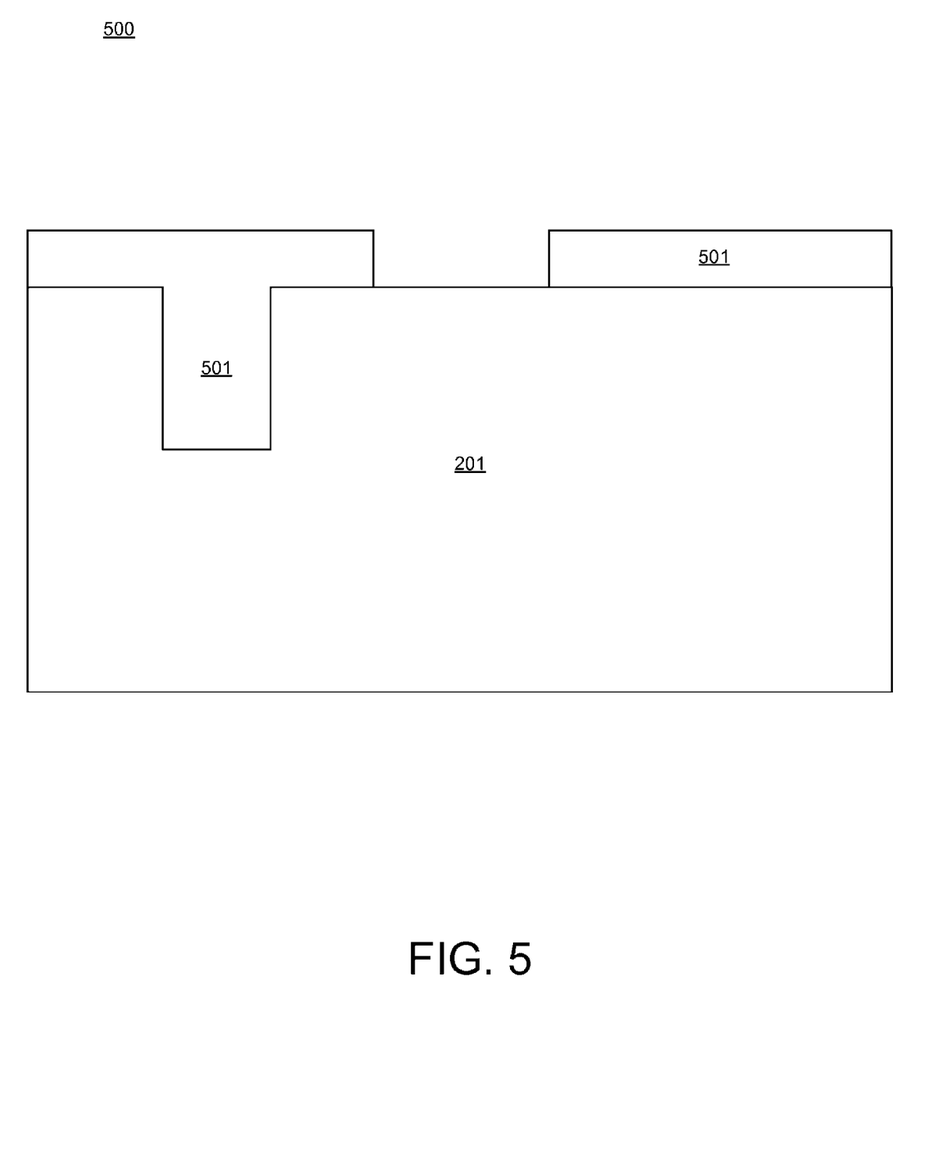
FIG. 5 illustrates an embodiment of a wafer after patterning of the hard mask layer and removal of the resist.
Figure 6:
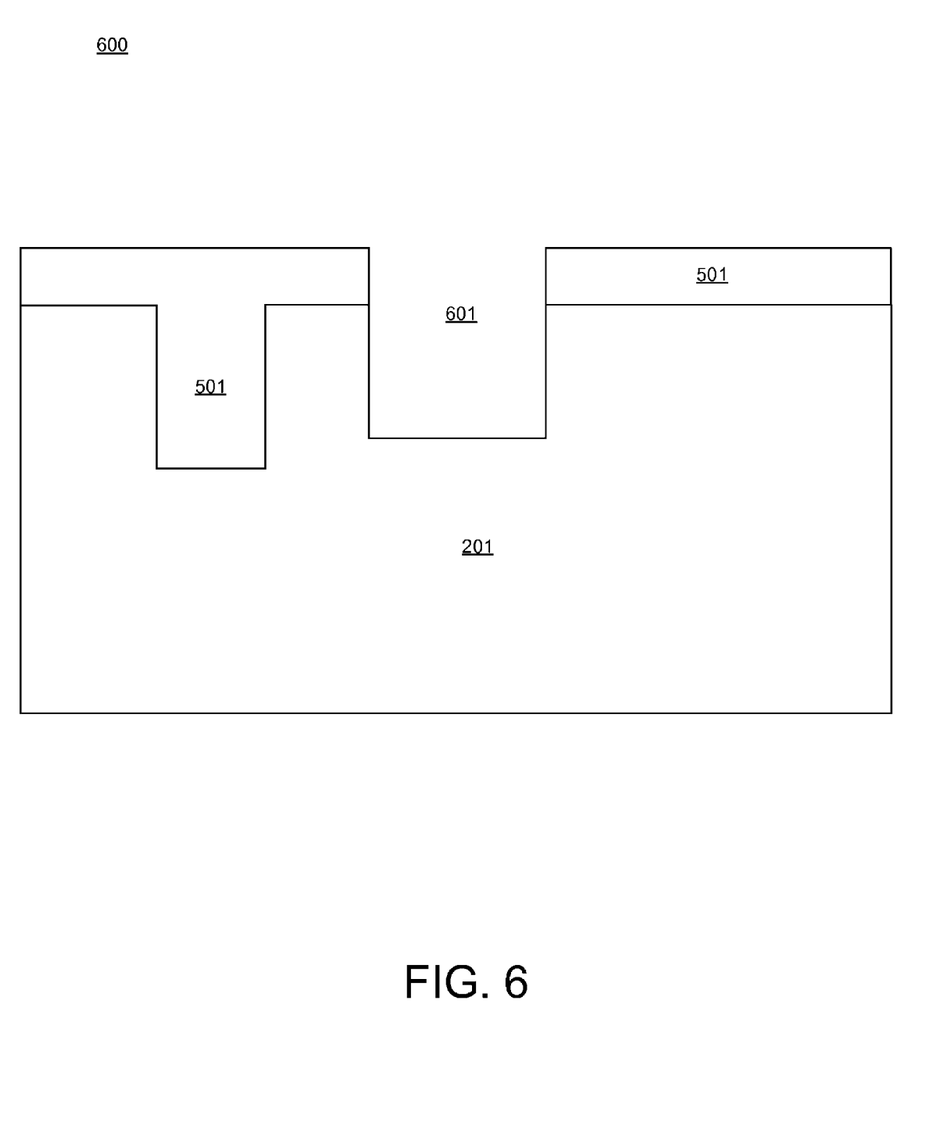
FIG. 6 illustrates an embodiment of a wafer after etching of a silicon germanium growth trench.

FIG. 1 illustrates an embodiment of a method 100 for fabricating a structure for use in fabrication of a PiN heterojunction TFET. FIG. 1 is discussed with reference to FIGS. 2-14. In block 101, a zero level trench, or alignment trench, and a SiGe growth trench are formed in a silicon wafer. The zero level trench acts as an alignment layer that may be used to align wiring levels in that are formed in subsequent processing steps, including the gate polysilicon conductor layer (PC) and active silicon conductor layer (RX). One embodiment of a method of forming a zero level trench and a SiGe growth trench is shown in FIGS. 2-6. First, as shown in FIG. 2, a zero level trench 202 is formed in silicon 201. Zero level trench 202 may be formed using either silicon dioxide or silicon nitride in some embodiments. As shown in FIG. 3, a hard mask 301 is then formed on silicon 201. Mask 301 may comprise an oxide or a nitride in some embodiments. Then, as shown in FIG. 4, photoresist 401 is deposited on hard mask 301. The hard mask 301 is then patterned and photoresist 401 is removed as shown in FIG. 5, resulting in etched mask regions 501 on silicon 201. Then as shown in FIG. 6, silicon germanium (SiGe) growth trench 601 is etched in silicon 201. The depth of SiGe growth trench 601 may be on the order of about 50 nanometers (nm). In another embodiment, mask 301 and photoresist 401 may be deposited on silicon 401 before zero level trench 202 is formed, in such a manner that zero level trench 202 may be formed in silicon 201 simultaneously with the etching of trench 601.

Figure 7:
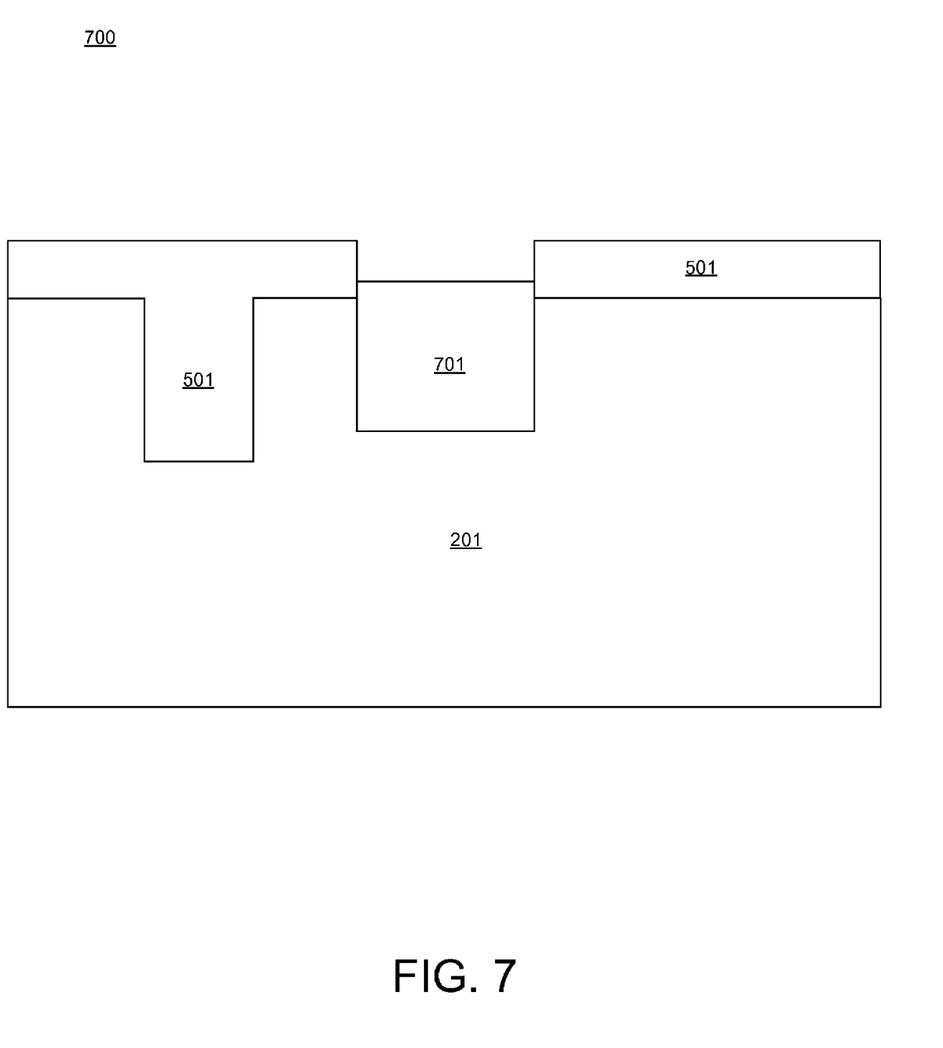
FIG. 7 illustrates an embodiment of a wafer after growth of p-type doped silicon germanium in the silicon germanium growth trench.

In block 102, as shown in FIG. 7, in-situ P-type doped SiGe 701 is grown in SiGe growth trench 601. P-doped SiGe 701 may be doped with boron in some embodiments. The depth of SiGe 701 may be on the order of about 50 nm in some embodiments.

Figure 8:
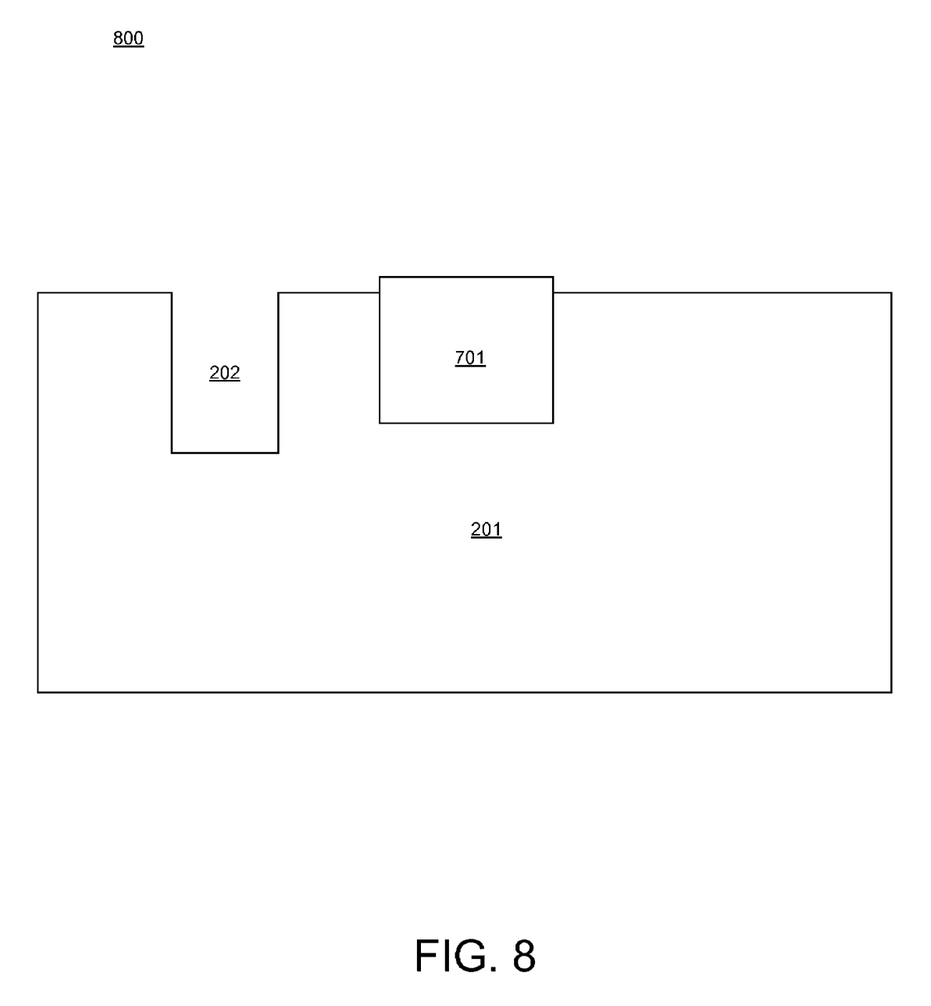
FIG. 8 illustrates an embodiment of a wafer after removal of the hard mask.
Figure 9:
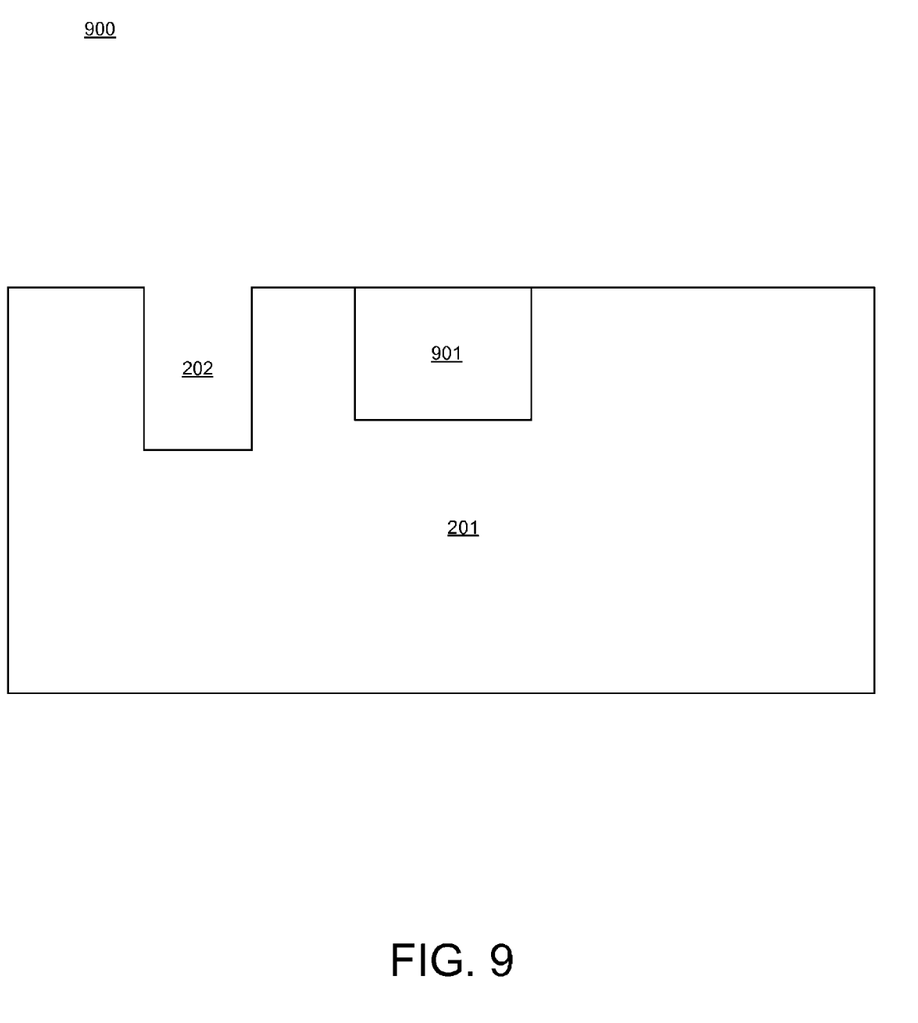
FIG. 9 illustrates an embodiment of a wafer after polishing.
Figure 10:
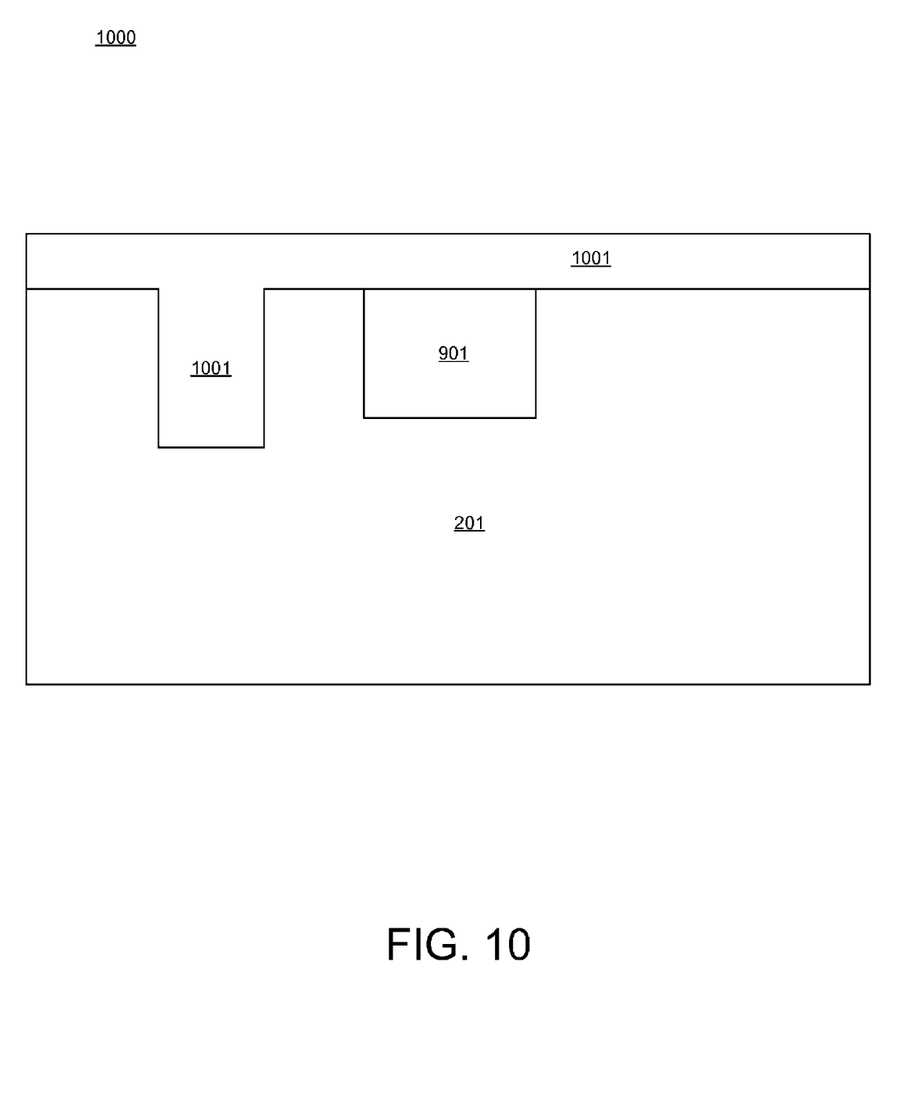
FIG. 10 illustrates an embodiment of a wafer after formation of an oxide layer.

In block 103, as shown in FIG. 8, etched mask 501 is removed, leaving zero level trench 202 in silicon 201. Polishing may then be performed as shown in FIG. 9, resulting in polished SiGe 901. The polishing may comprise chemical mechanical polishing (CMP) in some embodiments; any appropriate polishing method may be used to planarize silicon 201 and SiGe 901. Then, as shown in FIG. 10, a dielectric layer comprising an oxide layer 1001 is formed on the surface of silicon 201 and SiGe 901, and in zero level trench 202. Oxide layer 1001 may be formed by any appropriate method including but not limited to atomic layer deposition (ALD) or chemical vapor deposition (CVD). Oxide layer 1001 may be planarized by any appropriate method after it is formed.

Figure 11:
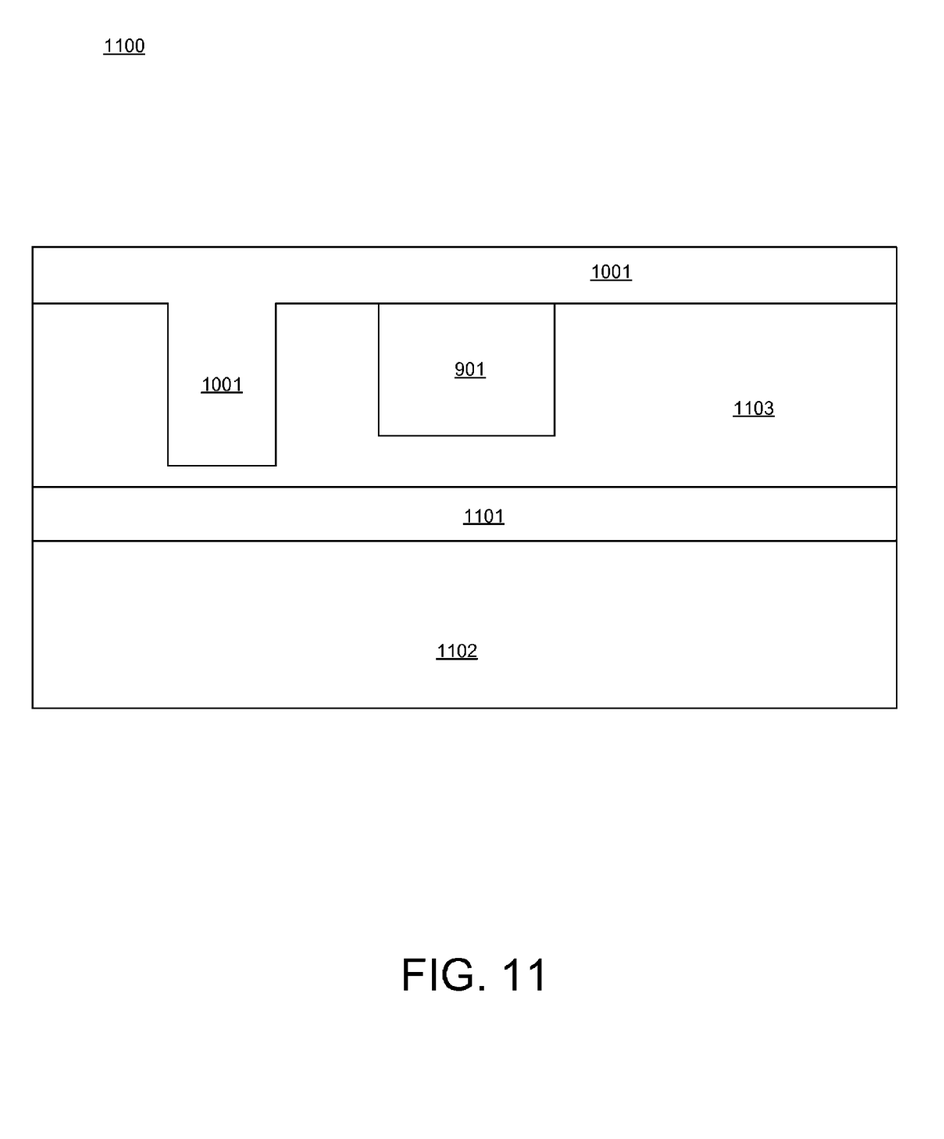
FIG. 11 illustrates an embodiment of a wafer after hydrogen implantation.

In block 104, as shown in FIG. 11, high-energy hydrogen is implanted into silicon 201 to form hydrogen implantation region 1101. Implantation region 1101 forms a cleaving plane between upper silicon region 1103 and lower silicon region 1102.

Figure 12:
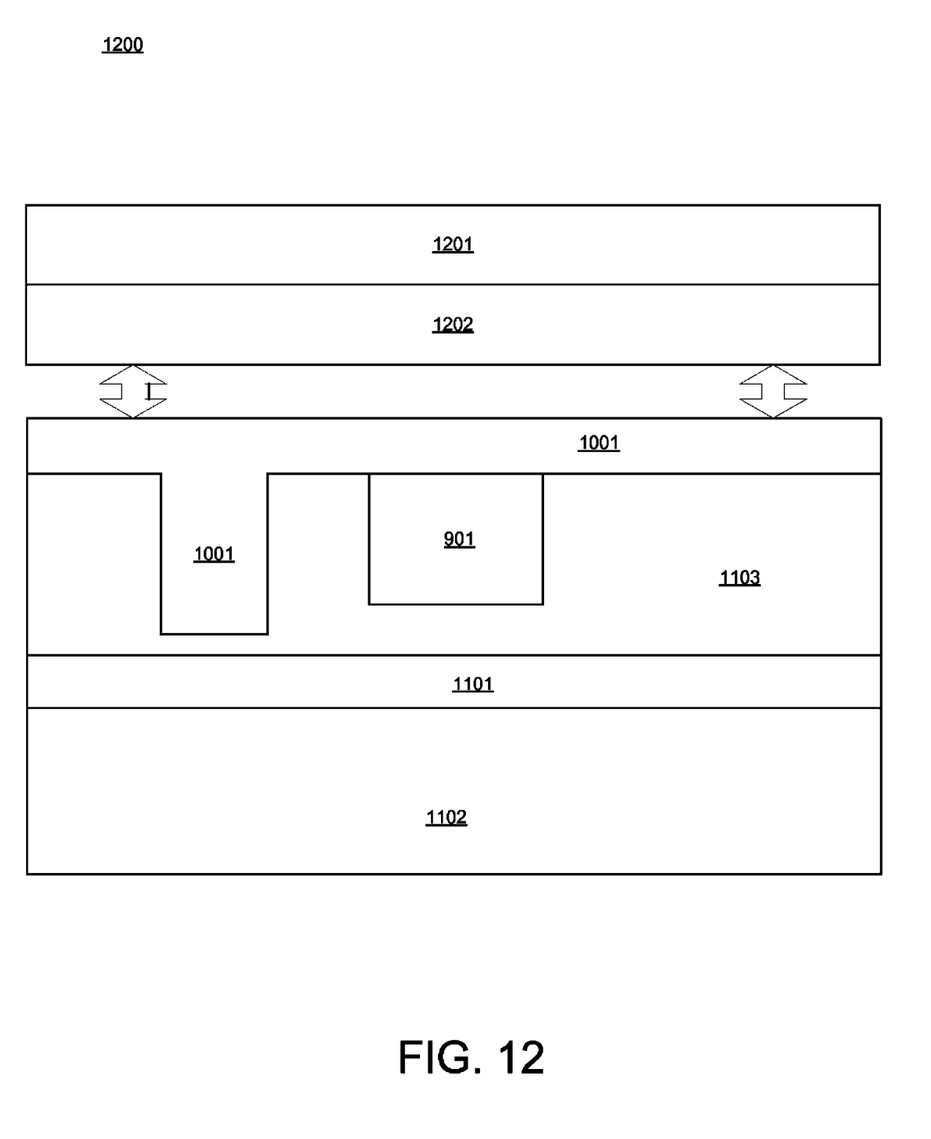
FIG. 12 illustrates an embodiment of a handle wafer.
Figure 13:
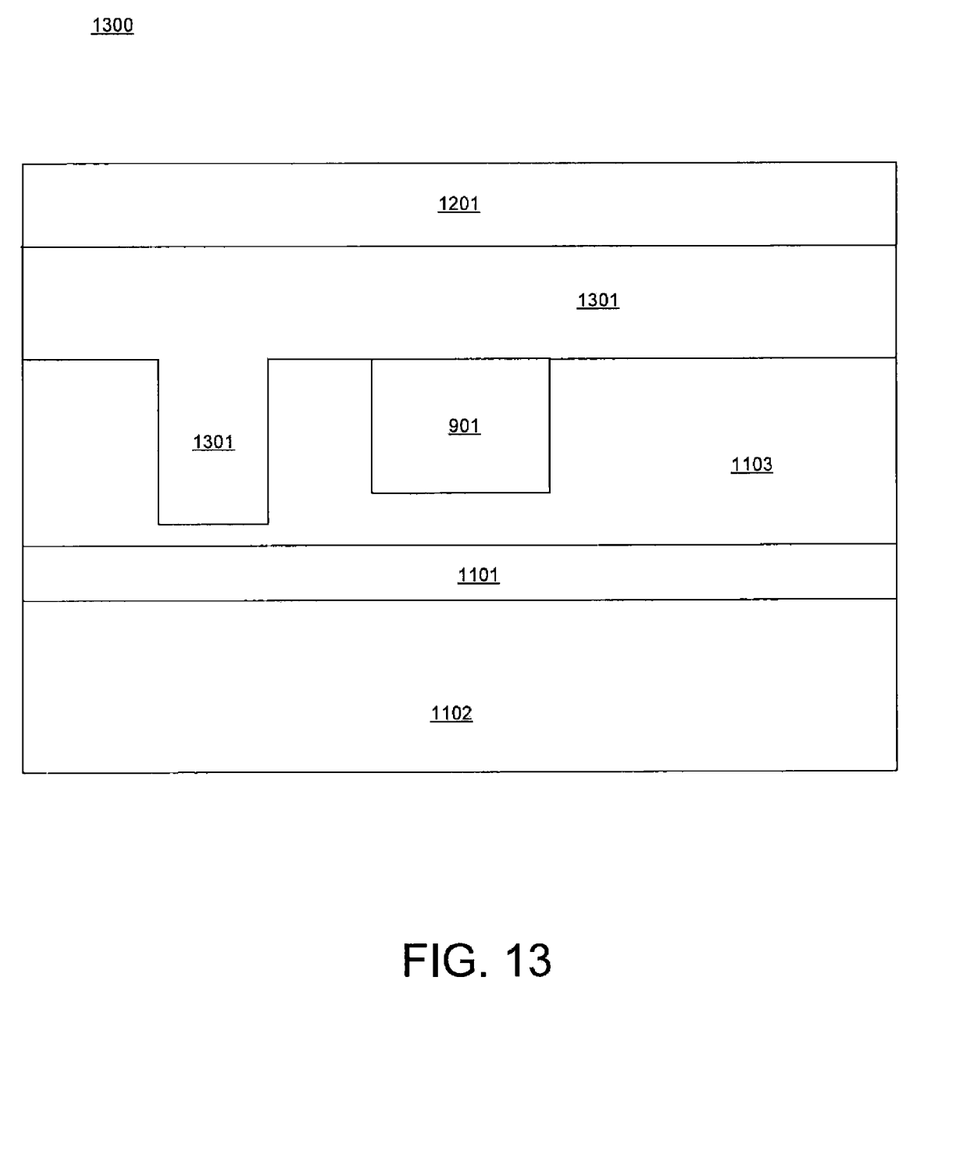
FIG. 13 illustrates an embodiment of a wafer after bonding to the handle wafer.

In block 105, wafer 1200 is bonded to a handle wafer comprising bulk silicon 1201 and a top thermal oxide 1202, as shown in FIG. 12. Top thermal oxide 1202 bonds with oxide layer 1001, as shown in FIG. 13, resulting in oxide layer 1301. Oxide layer 1301 may be between about 50 to about 400 nm thick in some embodiments.

In block 106, wafer 1300 is annealed, releasing silicon 1102 from silicon 1103 at the cleaving plane comprising implantation region 1101. Annealing may comprise spike annealing or flash annealing. The resulting structure 1400, shown in FIG. 14, may then be polished, resulting in a thickness of silicon 1103 between about 10 to about 50 nm in some embodiments. Polishing may comprise CMP in some embodiments.

Figure 14:
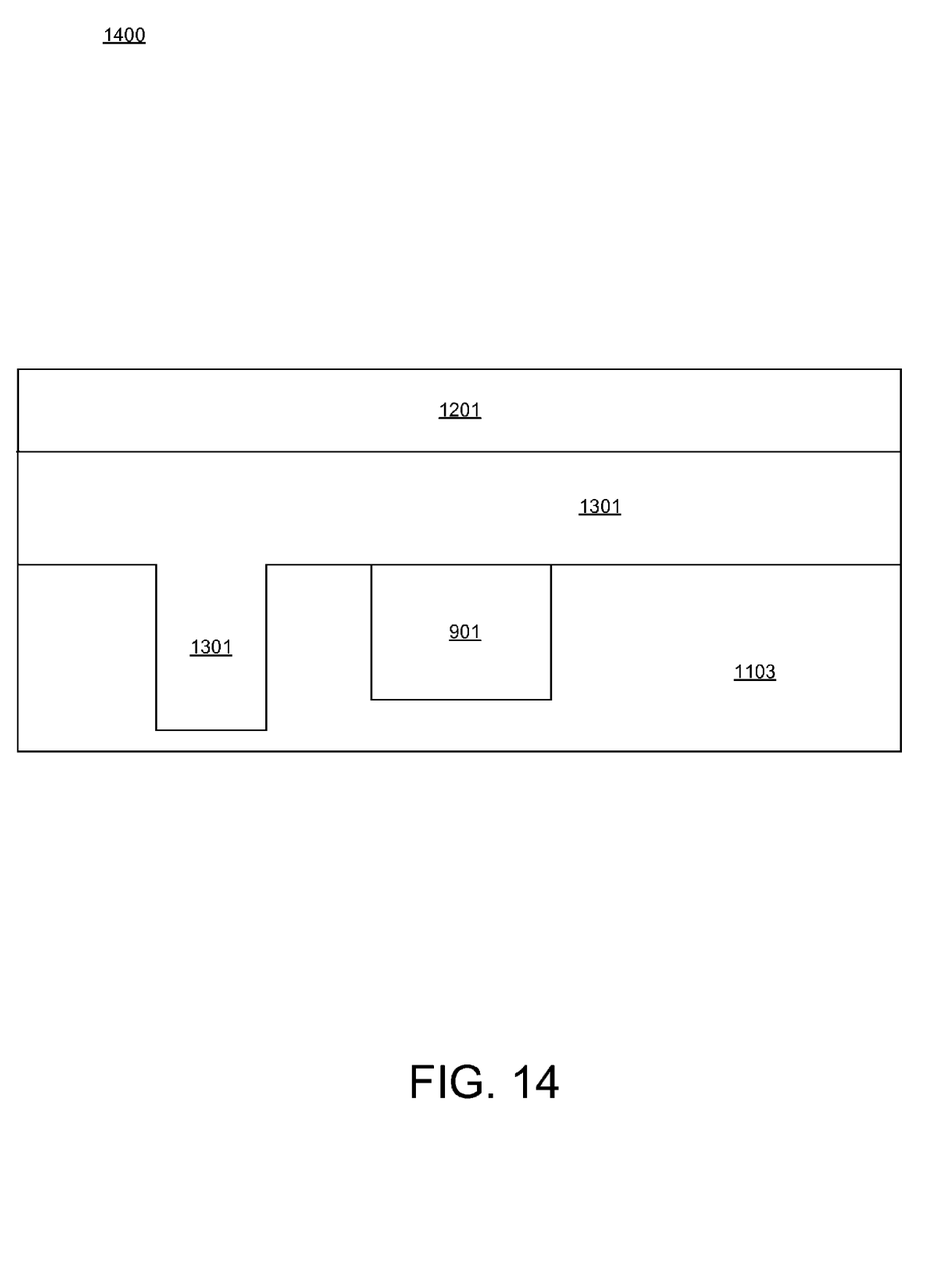
FIG. 14 illustrates an embodiment a structure for use in fabrication of a PiN heterojunction TFET.

Structure 1400 comprises a top-down silicon nanowire structure for use in fabrication of a PiN heterojunction TFET device. P-type SiGe region 901 comprises a nanowire, and may comprise the p-type region of a PiN heterojunction that may comprise a TFET tunnel barrier. Structure 1400 also comprises an alignment layer (i.e., zero level trench 202) that may be used to align wiring levels that are formed in subsequent fabrication steps, including the gate polysilicon conductor layer (PC) and active silicon conductor layer (RX), to the p-type SiGe nanowire layer. A PiN heterojunction may be formed on structure 1400 using top-down nanowire fabrication methods. The n-type region of the PiN heterojunction may be formed by n-type diffusion implant, which may be performed using either non-self aligned masking (as in lateral TFET devices) or through a high angle asymmetric implantation. The n-doped portion of the PiN heterojunction structure may comprise self-aligned doped n-type material.

The technical effects and benefits of exemplary embodiments include fabrication of a PiN heterojunction TFET that may operate at its quantum capacitance limit.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for fabricating a device comprising a PiN heterojunction tunnel field effect transistor (TFET), the method comprising:
    forming an alignment trench in a silicon wafer;
    forming a silicon germanium (SiGe) growth trench in the silicon wafer;
    growing a p-type SiGe region in the SiGe growth trench;
    forming a first oxide layer over the alignment trench and the p-type SiGe region, wherein the first oxide layer fills the alignment trench;
    forming a hydrogen implantation region in the silicon wafer underneath the p-type SiGe region and the alignment trench, the hydrogen implantation region dividing the silicon wafer into a upper silicon region and a lower silicon region, and wherein the upper silicon region comprises the alignment trench and the p-type SiGe region;
    bonding the first oxide layer to a second oxide layer located on a handle wafer, forming a bonded oxide layer comprising the first oxide layer and the second oxide layer, wherein the bonded oxide layer fills the alignment trench;
    separating the lower silicon region from the upper silicon region at the hydrogen implantation region; and
    forming the PiN heterojunction TFET using the upper silicon region, wherein the p-type SiGe region comprises a p-type region of a PiN heterojunction that comprises a tunnel barrier of the PiN heterojunction TFET, and wherein the alignment trench is used to align a wiring level of the device comprising the PiN heterojunction TFET to the p-type SiGe region during formation of the device comprising the PiN heterojunction TFET.

2. The method of claim 1, wherein the p-type SiGe region comprises in-situ boron-doped SiGe.

3. The method of claim 1, wherein the depth of the p-type SiGe region is about 50 nanometers (nm) or less.

4. The method of claim 1, further comprising polishing the p-type SiGe region after growing the p-type SiGe region.

5. The method of claim 4, wherein polishing comprises chemical mechanical polishing (CMP).

6. The method of claim 1, wherein forming the first oxide layer comprises one of atomic layer deposition (ALD) of oxide or chemical vapor deposition (CVD) of oxide.

7. The method of claim 1, wherein the handle wafer comprises the second oxide layer and a bulk silicon layer.

8. The method of claim 1, wherein the thickness of the bonded oxide layer is between about 50 nm and about 400 nm.

9. The method of claim 1, wherein separating the lower silicon region from the upper silicon region at the hydrogen implantation region comprises one of spike annealing or flash annealing.

10. The method of claim 1, further comprising polishing the upper silicon layer to a desired thickness after separating the lower silicon region from the upper silicon region.

11. The method of claim 10, wherein the desired thickness of the upper silicon layer is between about 10 nm and about 50 nm.

12. The method of claim 1, wherein forming the SiGe growth trench in the silicon wafer comprises:
   forming a hard mask layer on a top surface of the silicon wafer, wherein the hard mask layer fills the alignment trench;
   depositing and patterning photoresist on the hard mask layer;
   etching the hard mask layer using the patterned photoresist as a mask;
   removing the photoresist; and
   etching the SiGe growth trench in the silicon wafer using the etched hard mask layer as a mask.

13. The method of claim 12, further comprising removing the hard mask layer from the top surface of the silicon wafer and the alignment trench after growing the p-type SiGe region in the SiGe growth trench, and before forming the first oxide layer.

14. The method of claim 13, further comprising polishing the p-type SiGe region after removing the hard mask layer, such that a top surface of the p-type SiGe region and the top surface of the silicon wafer are planarized by the polishing, and wherein the first oxide layer is formed over the planarized top surface of the p-type SiGe region and the planarized top surface of the silicon wafer.

15. The method of claim 1, wherein the wiring level comprises one of a gate polysilicon conductor layer and an active silicon conductor layer.

* * * * *